US007193422B2

(12) United States Patent
Velleca et al.

(10) Patent No.: US 7,193,422 B2
(45) Date of Patent: Mar. 20, 2007

(54) PATCH PANEL SYSTEM

(75) Inventors: Frank Velleca, Woodbury, CT (US); John A. Siemon, Woodbury, CT (US)

(73) Assignee: The Siemon Company, Watertown, CT (US)

( * ) Notice: Subject to any disclaimer, the term of this patent is extended or adjusted under 35 U.S.C. 154(b) by 88 days.

(21) Appl. No.: 11/037,859

(22) Filed: Jan. 18, 2005

(65) Prior Publication Data

US 2005/0186819 A1 Aug. 25, 2005

Related U.S. Application Data

(60) Provisional application No. 60/537,946, filed on Jan. 20, 2004.

(51) Int. Cl.
*G01R 31/04* (2006.01)
*G21C 17/00* (2006.01)

(52) U.S. Cl. ...................................... 324/538; 702/183

(58) Field of Classification Search ................ 324/538, 324/537, 66; 361/778; 370/241, 248; 439/59, 439/62, 63, 188; 702/122, 183
See application file for complete search history.

(56) References Cited

U.S. PATENT DOCUMENTS

| | | | | |
|---|---|---|---|---|
| 4,366,566 | A * | 12/1982 | Cochennec | 370/359 |
| 5,550,755 | A * | 8/1996 | Martin et al. | 340/825.36 |
| 6,421,322 | B1 * | 7/2002 | Koziy et al. | 370/248 |
| 6,433,558 | B1 * | 8/2002 | Sciacero et al. | 324/628 |
| 6,684,179 | B1 * | 1/2004 | David | 702/183 |
| 6,725,177 | B2 * | 4/2004 | David et al. | 702/183 |
| 6,961,675 | B2 * | 11/2005 | David | 702/183 |
| 2006/0282529 | A1 | 12/2006 | Nordin | |

OTHER PUBLICATIONS

SafeGround, Telesafe AS, Aug. 1, 2001, pp. 1-2.
Don't let rules of thumb set decoupling-capacitor values, Vincent W. Greb, EDN Access, Sep. 1, 1995, pp. 1-2.
Decoupling in High-Speed Environments, White Electronic Designs Corp., Sep. 1998, pp. 1-4.
Decoupling Double-Density Components, Stanley Hronik, Integrated Device Technology, Inc. 1996, pp. 109-112.
Guidelines for Using Decoupling Capacitors on DSP Designs, Ralph Weir and Gene Frantz, Digital Signal Processing Products, Semiconductor Group, Texas Instruments, Jun. 1993, pp. pp. 1-7.
Decoupling capacitors: use them or fail, EDN Access, Ron Mancini, Sep. 12, 1997, pp. 1-2.

* cited by examiner

*Primary Examiner*—Andrew H. Hirshfeld
*Assistant Examiner*—Hoai-An D. Nguyen
(74) *Attorney, Agent, or Firm*—Cantor Colburn LLP

(57) ABSTRACT

A patch panel system including a patch panel having a first outlet including a first conductive tab and a device having a second outlet including a second conductive tab. A patch cord has a first plug having a first screen for contacting the first tab and a second plug having a second screen for contacting the second tab. The patch cord includes a conductor electrically connecting the first screen and the second screen. An analyzer is electrically connected to the first tab and detects a connection between the first tab and the second tab along the conductor.

12 Claims, 4 Drawing Sheets

PATCH PANEL SYSTEM

CROSS REFERENCE TO RELATED APPLICATION

This application claims the benefit of U.S. provisional patent application Ser. No. 60/537,946, filed Jan. 20, 2004, the entire contents of which are incorporated herein by reference.

BACKGROUND OF THE INVENTION

Patch panels are often used to provide an interconnection between telecommunication outlets and active equipment. One difficulty experienced with patch panels is knowing which port of the patch panel is connected to which port on the active equipment. One solution to this problem is disclosed in U.S. Pat. No. 6,574,586, the contents of which are incorporated herein by reference. U.S. Pat. No. 6,574,586 discloses a system in which an adapter jacket having an external contact is placed on the plug. Outlets include an adapter board having a socket contact. The socket contacts are wired to an analyzer which then can determine which sockets are connected by patch cords by applying a signal to each socket contact.

A drawback to the system of U.S. Pat. No. 6,574,586 is that modifications must be made to the plug (i.e., the addition of an adapter jacket) and the outlet (i.e., the addition of the adapter board) to determine port connectivity. The adapter board requires additional space on the patch panel. Furthermore, existing commercially available patch cords do not include the adapter contact needed to engage the socket contact.

U.S. Pat. No. 5,483,467, the entire contents of which are incorporated herein by reference, discloses another system for monitoring port connectivity. This system also uses extraneous hardware such as an inductive coupler at each outlet.

There is a need in the art for a port connectivity monitoring system which uses existing patch cords to provide information on port connectivity with little or no space-consuming hardware components.

SUMMARY

An embodiment of the invention is a patch panel system including a patch panel having a first outlet including a first conductive tab and a device having a second outlet including a second conductive tab. A patch cord has a first plug having a first screen for contacting the first tab and a second plug having a second screen for contacting the second tab. The patch cord includes a conductor electrically connecting the first screen and the second screen. An analyzer is electrically connected to the first tab and detects a connection between the first tab and the second tab along the conductor.

DETAILED DESCRIPTION

Figure 1:
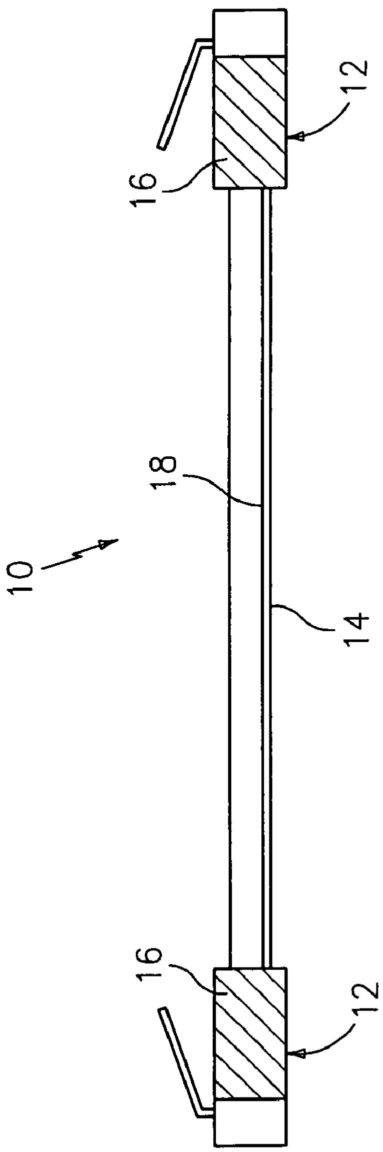
FIG. 1 depicts a patch cord for use in embodiments of the invention.

FIG. 1 depicts an exemplary patch cord for use in embodiments of the invention. The patch cord 10 includes plugs 12 connected by cabling 14. Each plug includes metallic screen 16. In one embodiment, cabling 14 includes 8 copper wires corresponding to 4 twisted pairs. A conductor 18 connects the metallic screens 16 on the plugs 12. Conductor 18 may be a cable screen (e.g., braid or foil shield) or may be a single wire. The screened patch cord, referred to as ScTP, is readily available and may be similar to the screened MC6™ patch cord available from The Siemon Company. Other shielded patch cords may be used such as fully shielded patch cords referenced in the art as FTP patch cords.

Figure 2:
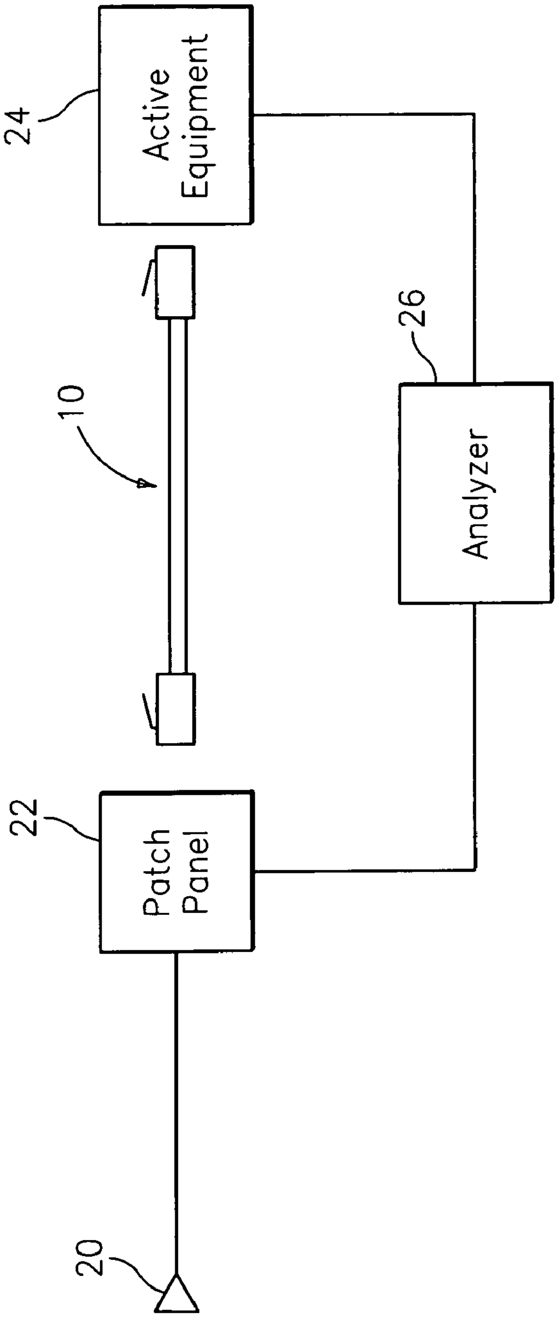
FIG. 2 depicts an exemplary patch panel system in an embodiment of the invention.

FIG. 2 depicts an exemplary patch panel system in an embodiment of the invention. FIG. 2 depicts a telecommunications outlet 20 connected to a patch panel 22 by horizontal cabling. The patch panel 22 is connected to a device such as active equipment 24 which may be a server, a hub, a switch, etc. An analyzer 26 is connected to both the patch panel 22 and the active equipment 24 to perform port connectivity monitoring as disclosed herein. The connection between a port on patch panel 22 and analyzer 26 may be made through a data port on the back of the patch panel 22.

Figure 3A:
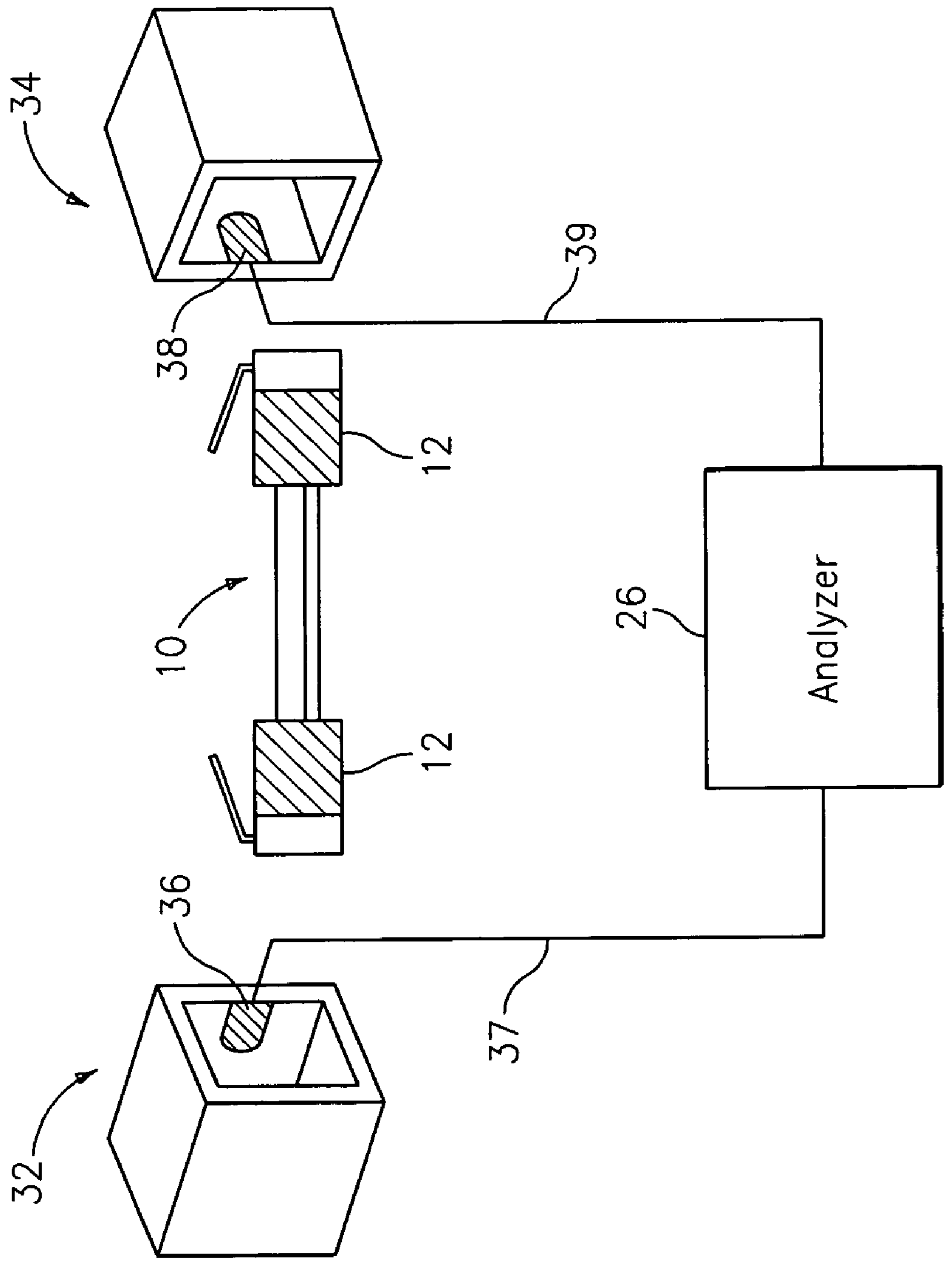
FIGS. 3A and 3B depict exemplary ports in embodiments of the invention.

FIG. 3A depicts exemplary outlets 32 and 34 which are part of patch panel 22 and active equipment 24, respectively. Outlet 32 includes a metal tab 36 on the interior of the outlet electrically connected to analyzer 26 by cable 37. Similarly, outlet 34 includes a metal tab 38 on the interior of the outlet electrically connected to analyzer 26 by cable 39. The metal tab 38 on outlet 34 is not electrically connected to other outlets on the active equipment 24. When patch cord 10 is mated to outlet 32, the metal screen 16 contacts tab 36. Similarly, when patch cord 10 is mated to outlet 34, screen 16 contacts tab 38. Analyzer 26 can then detect that outlet 32 on patch panel 22 is connected to outlet 34 on active equipment 24 through continuity testing. This system provides port-to-port connectivity information without significant additional hardware.

Figure 3B:
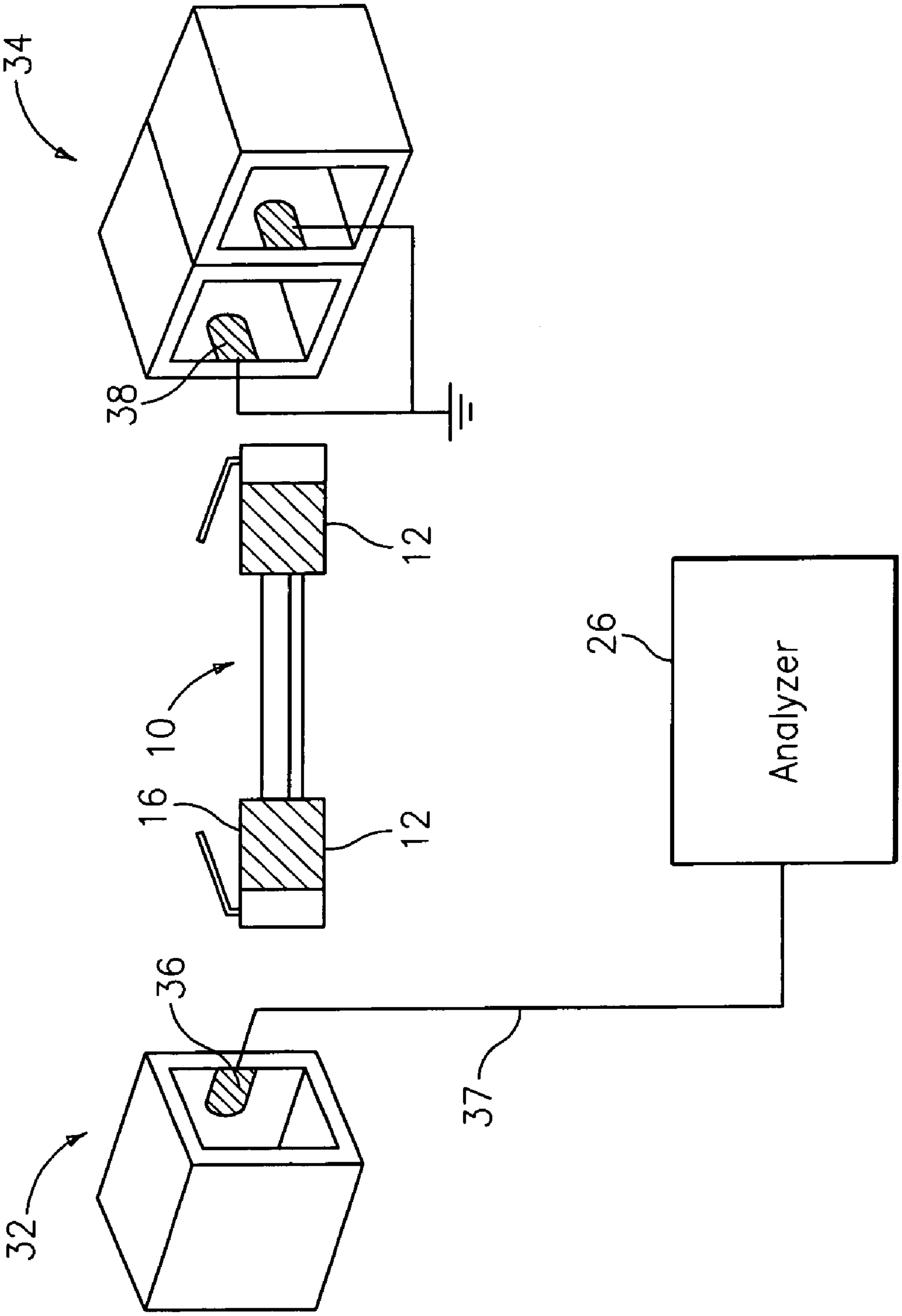

There are embodiments where the outlet 34 on the active equipment 24 does not include a tab 38 wired directly to analyzer 26. As shown in FIG. 3B, outlets 34 include tabs 38, or more substantial screening or shielding, connected to ground. As the ground plane is electrically connected across multiple outlets, individual outlets 34 on the active equipment 24 are not detected by the analyzer 26. In this embodiment, port-to-port connectivity is not be determined by analyzer 26, however, a determination that a port on patch panel 22 is connected to a port on the active equipment 24 may be made by analyzer 26.

When the active equipment 24 includes outlets having a common ground plane contacting screen 16, useful diagnostic information may still be obtained. For example, a user having difficulty at telecommunications outlet 20 may contact service personnel to report a problem. The user will provide an identifier for the telecommunications outlet 20 and the technician determines from a database the corresponding outlet on patch panel 22. Although the port-to-port connection between patch panel 22 and active equipment 24 is not known, the technician can determine whether a port on patch panel 22 is connected to active equipment 24. If a port is connected, the tab 36 will be grounded due to electrical connection with ground plane of outlet 34. The analyzer 26 provides this information based on a signal level at tab 36.

If not grounded, this indicates that the telecommunications outlet 20 is not connected to active equipment 24 and a routine service call is initiated. If the tab 36 is grounded, this indicates a connection exists between the patch panel 22 and active equipment 24. At this point, a technician could check active equipment 24 for malfunctioning ports, perform channel diagnostics, reset any ports on active equipment 24, etc.

Figure 4:
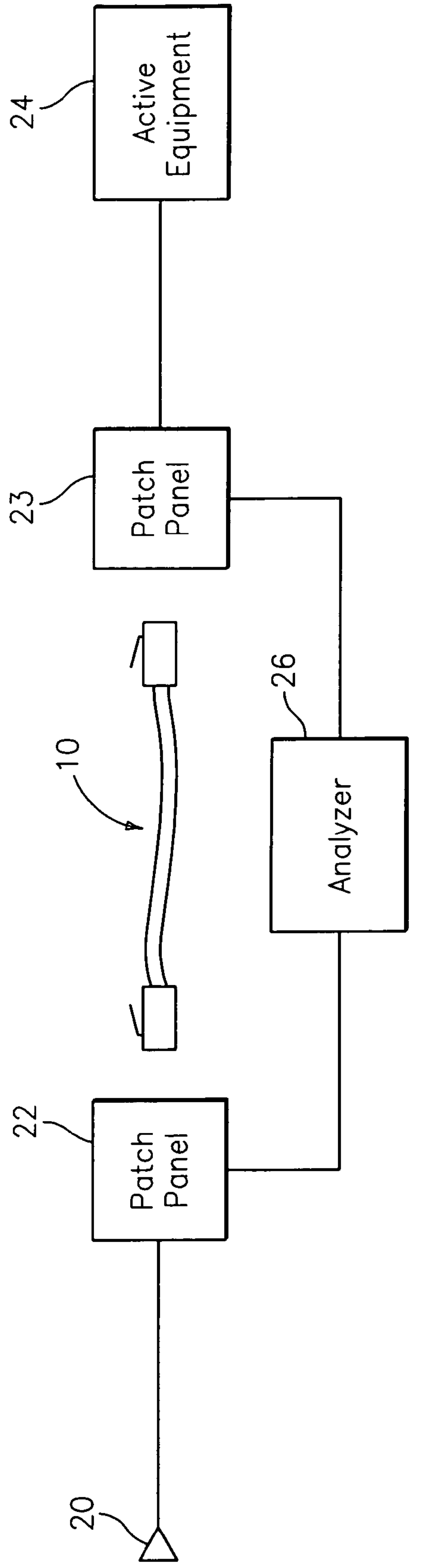
FIG. 4 depicts an exemplary patch panel system in an alternate embodiment of the invention.

FIG. 4 depicts an alternate embodiment in which port-to-port connectivity mapping is available, even if the active equipment 26 includes outlets electrically connected to a common ground plane. The embodiment of FIG. 4 includes an additional device such as patch panel 23. Patch panel 22 and patch panel 23 include outlets such as outlet 32 shown in FIG. 3A. These outlets include electrically isolated tabs 36 that establish electrical contact with screen 16 on plugs 12. In this configuration, analyzer 26 detects which port on patch panel 22 is connected to which port on patch panel 23 through continuity testing. The connection between telecommunications outlet 20 and patch panel 22 is already defined in a system database as known in the art. Similarly, the connection between ports on the active equipment 24 and patch panel 23 are defined in a system database as known in the art. Analyzer 26 uses the continuity data and the database information to determine port-to-port connectivity. By detecting the port-to-port connectivity between patch panel 22 and patch panel 23, an end-to-end path from the telecommunications outlet 20 to active equipment 24 is defined. This facilitates troubleshooting of user difficulties.

In one scenario, a user having difficulty at telecommunications outlet 20 contacts service personnel to report a problem. As the entire path from the telecommunications outlet 20, patch panel 22, patch panel 23 and active equipment 24 is known, service personnel can determine the nature of the problem. The status of ports can be checked remotely. Alternatively, a technician can be dispatched to service the equipment with the knowledge of exactly which ports on each of patch panel 22, patch panel 23 and active equipment 24 are involved.

The above described embodiments provide determination of port-to-port connectivity (FIGS. 3A and 4) or determination that a patch panel port is connected to a port on the active equipment (FIG. 3B) while using readily available patch cords such as ScTP or FTP patch cords. No additional adapter boards are needed nor are adapter jackets needed on the plugs. This minimizes space required on racks in telecommunications rooms or data centers. These embodiments provide an intelligent patching system in either an interconnect or cross-connect configuration.

Figure 5:
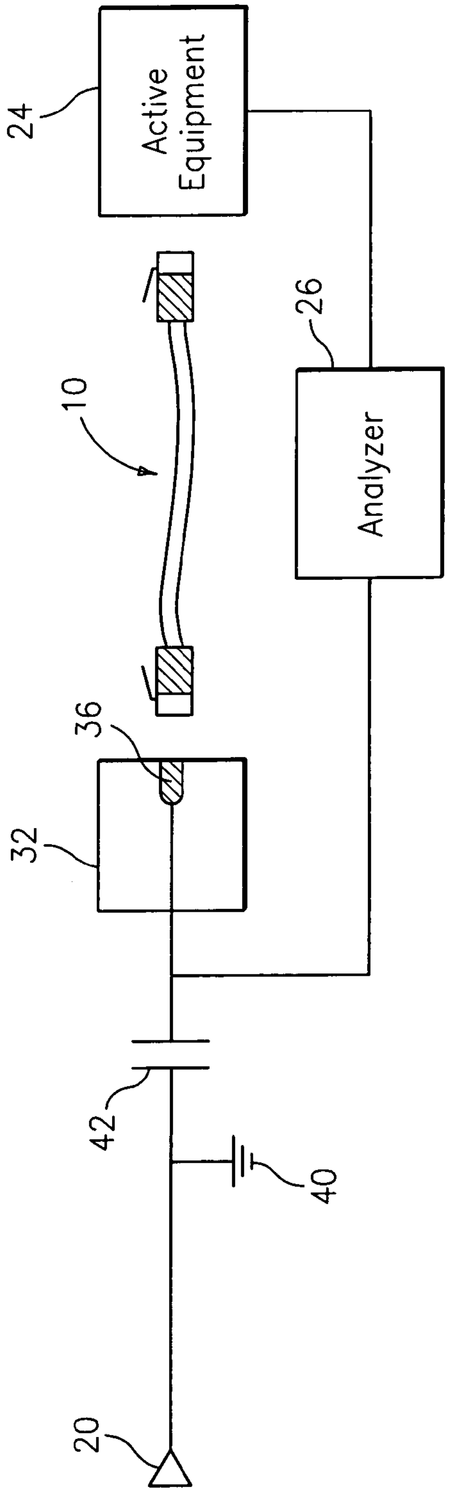
FIG. 5 depicts an exemplary patch panel system in an alternate embodiment of the invention.

FIG. 5 depicts an alternate embodiment in which the ground path between the telecommunications outlet and the active equipment 24 is interrupted in at least one location by a decoupling capacitor 42. The ground path from telecommunications outlet 20 is connected to ground 40, and then to the metal tab 36 on outlet 32 through decoupling capacitor 42. Decoupling capacitor 42 is embedded in a patch panel or termination block ports and isolates incoming versus outgoing signals transmitted over the screen on ScTP or FTP patch cords.

This prevents DC ground currents from reaching the active equipment 24 and provides the ability to use standard, lower cost ScTP or FTP modular patch cords. DC isolation of each port maintains a proper ground path, yet enables continuity tracking using the screen or foil of the patch cord, thereby enabling use of lower cost screened (ScTP) or fully shielded (FTP) modular patch cords. The decoupling capacitor may be used without analyzer 26 to provide advantages in standard ScTP and FTP physical layer cabling systems. The DC isolation prevents shield current ground loops as caused by connection to equipment in different parts of a building that may be at different ground potentials.

Use of decoupling capacitor in physical layer ports allows use of the screen in ScTP or FTP systems for both effective grounding of the physical layer and sensing continuity between ports. Use of a decoupling capacitor to isolate incoming from outgoing connections provides DC isolation. One embodiment of the sensing method for LAN equipment is the use of the common ground of the power strip that the LAN equipment is plugged into to complete a circuit and sense connections between LAN equipment and the physical layer.

Embodiments have been described with respect to copper connectors having eight contacts such as the RJ-45 type connector. It is understood that other types of wire patch cords (e.g., coaxial cable) having a screen or shield may be used to detect port connectivity as disclosed herein. Furthermore, non-wire patch cords (e.g., fiber optic connectors) may include a metallic conductor and be used to detect port connectivity as disclosed herein.

While the invention has been described with reference to exemplary embodiments, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiments disclosed for carrying out this invention.

The invention claimed is:

1. A patch panel system comprising:

a patch panel having a first outlet for receiving a plug, an interior surface of the first outlet having mounted thereon a first conductive tab;

a device having a second outlet for receiving a plug, an interior surface of the second outlet having mounted thereon a second conductive tab;

a patch cord having at one end a first plug matable with the first outlet, the first plug having a conductive first screen on an external surface thereof, the first screen for contacting the first tab at the other end a second plug matable with the second outlet, the second plug having a conductive second screen on an external surface thereof, the second screen for contacting the second tab, and a conductor electrically connecting the first screen and the second screen;

an analyzer electrically connected to the first tab, the analyzer detecting a connection between the first tab and the second tab along the conductor.

2. The system of claim 1 wherein:

the conductor is a single wire.

3. The system of claim 1 wherein:

the conductor is a screen of the patch cord.

4. The system of claim 1 wherein:

the second tab is a shield of the second outlet.

5. The system of claim 1 wherein:

the analyzer is electrically connected to the second tab, the analyzer determining that the patch cord connects the first outlet to the second outlet.

6. The system of claim 1 wherein:

the second tab is connected to ground, the analyzer determining that the patch cord connects the first outlet to an outlet on the device.

7. The system of claim 1 wherein:

the device is active equipment.

8. The system of claim 1 wherein:

the device is a second patch panel.

9. The system of claim 8 further comprising:

active equipment connected to the second patch panel.

10. The system of claim 1 further comprising:

a telecommunications outlet connected to the first outlet, a path between the telecommunication outlet and the first outlet including a ground path.

11. The system of claim 10 further comprising:

a decoupling capacitor positioned in the ground path in series with the telecommunications outlet and the first outlet.

12. The system of claim 1 wherein:

the first plug is an RJ-45 plug having eight contacts for 4 wires pairs, the conductor being a ninth conductor on the patch cord.

* * * * *